United States Patent [19]

Wolk

[11] Patent Number: 4,671,349

[45] Date of Patent: Jun. 9, 1987

[54] WELL LOGGING ELECTRONICS COOLING SYSTEM

[76] Inventor: Piero Wolk, 1717 Brittmore, Houston, Tex. 77043

[21] Appl. No.: 863,452

[22] Filed: May 15, 1986

Related U.S. Application Data

[63] Continuation of Ser. No. 712,722, Mar. 18, 1985, abandoned.

[51] Int. Cl.⁴ ............................................. H01L 23/42
[52] U.S. Cl. .................................. 165/47; 165/104.26; 165/104.33; 165/902; 361/385
[58] Field of Search ...................... 165/47, 902, 104.26, 165/104.11, 104.33; 62/119; 361/385

[56] References Cited

U.S. PATENT DOCUMENTS

| | | | |
|---|---|---|---|
| 3,038,074 | 6/1962 | Scherbatskay | 165/902 |
| 3,105,148 | 9/1963 | Monaghan et al. | 165/902 |
| 3,258,593 | 6/1966 | Reed et al. | 165/902 |
| 3,265,893 | 8/1966 | Rabson et al. | 165/902 |
| 3,714,981 | 2/1973 | Noran | 165/47 |
| 4,169,387 | 10/1979 | Krempl | 165/47 |
| 4,407,136 | 10/1983 | Kanter | 62/119 |
| 4,485,670 | 12/1984 | Camarda et al. | 165/104.26 |
| 4,513,352 | 4/1985 | Bennett et al. | 165/902 |

Primary Examiner—Albert W. Davis, Jr.
Attorney, Agent, or Firm—Matthews & Associates

[57] ABSTRACT

Well bore logging apparatus including electrical components cooling apparatus. An operating chamber and a heat sink chamber are incorporated. A heat transfer chamber encloses both operating chamber and heat sink chamber. A wicking material fills a portion of the transfer chamber to be in thermal connection with both operating chamber and heat sink chamber. The heat sink chamber contains a heat sink material. A heat transfer medium is contained in the heat transfer chamber which is vaporized by heat from the operating chamber, then condensed by the heat sink medium to be absorbed into the wicking member and transported through the wicking member by capillary action back to the operating chamber for revaporization. Heat transfer chamber is isolated from operating chamber.

19 Claims, 2 Drawing Figures

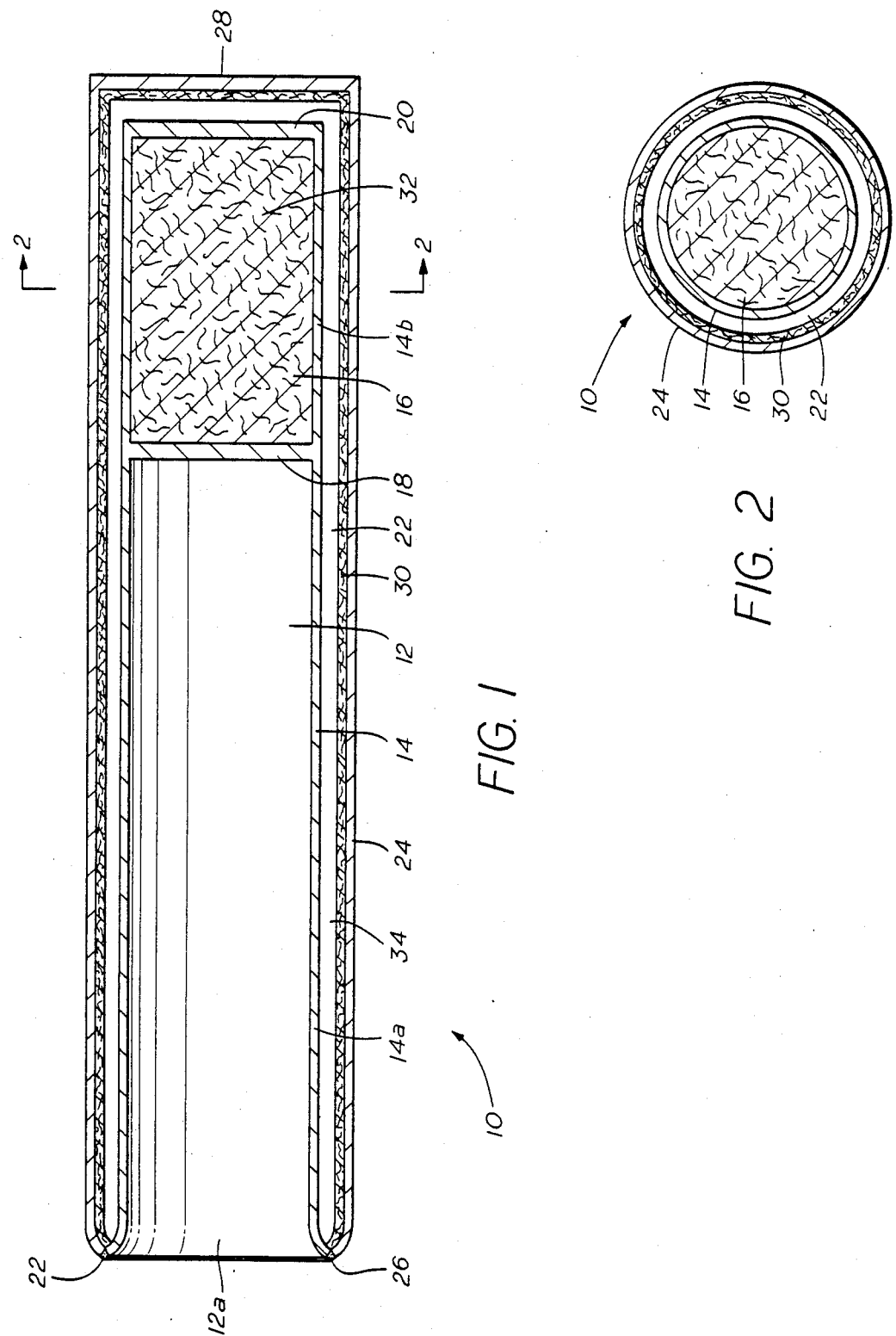

WELL LOGGING ELECTRONICS COOLING SYSTEM

This application is a continuation of application Ser. No. 712,722, filed Mar. 18, 1985 now abandoned.

FIELD OF THE INVENTION

This invention pertains to apparatus incorporated into a well logging tool to maintain the temperature of the electronic components below damaging the high temperatures.

BACKGROUND OF THE INVENTION

The temperature in a well bore generally increases with increase in depth of the well bore. As an example, some well bores along the Texas Gulf Coast will have temperatures in excess of 300° F. at 15,000′ depth.

Some electrical components will fail at temperatures above 250° F.; other components will survive until temperatures of 300° F. or greater is encountered. Almost all electrical components become subject to failure at temperatures in excess of 400° F.

There have been various approaches to protecting the electronic components from the excessive heat in well bores. One approach has been to insulate the electronics from the surrounding well bore and also to provide a "heat sink" in with the electronics to absorb such heat as passes through the insulation.

As another approach, the "vacuum bottle" or Dewar type insulated enclosure has been commonly used. The heat sink utilized has been either a eutectic material or some metal, such as brass. One such eutectic substance has a trade name of "Cerrobend" which is a composition including cadmium, bismuth, lead and tin in proportions such that the melting temperature is about 158° F.

Another kind of apparatus which is used to remove heat from a particular environment is commonly called a "heat pipe". The heat pipe is an elongated tube having a wick running through its length with one end of the tube being in the hot environment and the other end being in a cooler or cold environment. The tube is charged with a selected amount of liquid having a particular boiling point such that the liquid will boil in the hot environment and give off vapors which will travel through the tube into the colder environment. In the colder environment the vapors condense back into the liquid which is soaked up by the wick and transferred through the wick by capillary action back to the hotter environment where the evaporating cycle is repeated. Such heat pipes can be very efficient so long there is an appreciable difference in the temperatures of the hot environment and the cool environment.

Prior art cited in the parent of this application was deKanter U.S. Pat. No. 4,407,136 Krempl U.S. Pat. No. 4,169,387, Noran U.S. Pat. No. 3,714,981, and Camarda U.S. Pat. No. 4,485,670. No more pertinent prior art is known.

OBJECTS OF THE INVENTION

The primary object of this invention is to provide a system which will maintain the environment of the electronics at temperatures below damaging temperatures while the logging tool is being used in a well bore where damaging temperatures exist.

Another object of this invention is to provide apparatus that can be "recharged" back to an optimum condition to cool the electronics after each trip of the tool in a well bore.

SUMMARY OF THE INVENTION

The heat transfer apparatus of the present invention is adapted to cool the electrical components of a well logging instrument during the time period that the instrument is being operated in a hot bore hole. The apparatus incorporates an operating chamber having an entry opening within an elongated inner housing, a heat sink chamber located within the inner housing, and a heat transfer chamber enclosing both the operating chamber and the heat sink chamber. A wicking material is disposed to fill a portion of the transfer chamber along its length so as to be in thermal connection with both the operating chamber and the heat sink chamber. A heat sink material or medium is disposed in the heat sink chamber so as to be in effective heat transfer relationship with the heat transfer chamber. The heat transfer chamber also contains a heat transfer medium which is adapted to be (1) vaporized from a liquid into a vapor by heat received from the operating chamber, (2) to be passed as a vapor to the vicinity of the heat sink chamber, (3) to be condensed from vapor into a liquid by removal of the heat by the heat sink medium, and (4) to be drawn as a liquid through the wicking means back to the operating chamber to again vaporize. The heat transfer medium is operative when the temperature in the operating chamber is sufficient to vaporize the medium and when the heat sink temperature is appropriate to condense the resulting vapors back into a liquid form. The wicking material may be either woven, felted or sintered. The heat sink medium may be a metal having a selected specific heat. Alternatively, the heat sink medium may be a eutectic material having a prescribed heat of fusion. The heat transfer medium may be water and the wicking material may be of felt, as examples. An insulating material may be provided to close off the opening of the operating chamber and the electronics mounted within that chamber.

BRIEF DESCRIPTION OF THE DRAWINGS

FIG. 1 is a side elevation view taken in cross-section of the heat transfer apparatus of the present disclosure.

FIG. 2 is a cross-sectional view taken from the line 2—2 of FIG. 1.

DESCRIPTION OF THE PREFERRED EMBODIMENT

Numeral 10 designates the heat transfer apparatus in FIGS. 1 and 2. In operation the apparatus 10 is included in well logging apparatus (not shown) which is disposed in a well bore. An operating chamber 12 to house electrical components is defined within a section 14a of an inner housing 14. A heat sink chamber 16 is also defined within another section 14b of the inner housing 14 and by a divider bulkhead 18 and an end bulkhead 20.

A heat transfer chamber 22 is defined between inner housing 14 and an outer housing 24. The heat transfer chamber 22 is sealed at one end with a weld 26 between the inner and outer housings and a closure bulkhead 28 at its other end.

As defined by the sections 14a and 14b of the inner housing 14, the outer housing 24, the end bulkhead 20 and the closure bulkhead 28, the sealed heat transfer chamber 22 completely encloses all exterior surfaces of the housing 14 and the end bulkhead 20.

A wicking member 30 is mounted to extend linearly coincident with the heat transfer chamber 22 as defined by the outer housing 24 and the closure bulkhead 28. The wicking member 30 leaves a space shown somewhat exaggeratedly in the heat transfer chamber 22 which is also coincident in extent to wicking member 30. As shown, the space permits passage of vapors from the section 14a to section 14b while also permitting respective heat transfer between the wicking member 30 and each of the sections 14b and 14a.

To give some perspective of the sizes of the heat transfer apparatus 10, the O.D. (outside diameter) of the outer housing 24 may be in the order of 1" to 4" and the length of the operating chamber 12 may be from 10" to 48", as examples.

As shown, the housing 14, the housing 24, and the bulkheads 18, 20 and 28 are all provided of metal and assembled as an integral unit with weldments (not shown). The metal may be, for example, 316 stainless steel or 318 stainless steel, or possibly some nickel alloy. The inner housing 14 is supported with relation to the outer housing 24 by means of the weld 26. Additionally, bracing of the inner housing 14 in position within the outer housing 24 may be provided by an internal structural member or increasing the thickness of part of the wicking member 30 around the end part in the vicinity of the bulkheads 20 and 28 as desired.

A heat sink medium or material 32 is provided within the heat sink chamber 22 in a manner ensuring good heat transfer between the medium 32 and the heat transfer chamber 22. The heat sink medium 32 should have a high specific heat. Since specific heat is closely related to specific gravity, those materials having higher specific gravities will normally have a higher specific heat. Examples of metals which may be used can of course include copper, brass, bronze, lead and the like. A eutectic compound or alloy may also advantageously be used as a heat sink material. An example is a material marketed under the trade name "Cerrobend" which is an alloy of bismuth, lead, tin and cadmium provided in proportions such that the melting temperature of the material is about 158° F. Such a heat sink additionally has the heat of fusion. Similar alloys can be provided having melting temperatures up to 200° F. and more.

A measured quantity of a heat transfer medium is provided within the heat transfer chamber 16 where it resides in both a liquid and a vapor form. A common heat transfer medium may be water, for example, from which the air, oxygen and mineral content has been removed, leaving only the liquid water and water vapor in the heat transfer chamber 22.

As an alternate embodiment, the heat transfer apparatus 10 may be mounted closely within a "vacuum bottle" type of Dewar flask (not shown). In such instance the Dewar flask would be similar in construction to the members defining the heat transfer chamber 22 but with an evacuated chamber. Such alternate construction could also include the outer housing 24 and closure bulkhead 28 of the present invention as being the inner housing and end bulkhead of the vacuum bottle.

OPERATION OF THE PREFERRED EMBODIMENT

In operation, electronic components are mounted within the operating chamber 12 through the entry opening 12a. The transfer chamber 10 including the heat sink medium 32 is cooled down, at least to ambient room temperature (72° F.), and preferably to a lower temperature. The transfer apparatus 10 is mounted vertically within a vertical well logging tool (not shown) generally with the open end 12a facing downwardly, in which case the electrical wiring comes up the outside of the outer housing 24 and into the well logging tool.

As the tool is lowered into the well bore the temperature gradually increases with increasing depth. Also, the electronics within the operating chamber 12 generate some amount of heat.

As the temperature of the well bore increases, heat is transmitted through the walls of the well logging tool and through the open end of the operating chamber 12 (even through any insulation provided at the opening 12a).

The maximum temperature which the tool encounters will be at the bottom of the well bore or at the deepest depth at which the well log is taken. In either event, the well logging tool is stopped at this depth to begin taking the well logging measurements.

The well bore is logged as the tool is withdrawn from the well at a steady rate, for example, 15 ft. per minute, through the zone in which it is desired to measure parameters of the well formation.

As the tool is raised up the well bore, the well bore temperature gradually decreases and the heat passing into the well logging tool also decreases in rate. At some point, the temperature in the well bore is no longer sufficiently elevated to be damaging to any of the electronics in the well logging tool. The time period in which the well logging tool has been descending to the lowermost depths and gradually raised while taking the log may extend to six hours, for example.

It is during this six hours interval that the heat transfer apparatus operates to remove heat from the operating chamber 12 and maintain the temperature in the operating chamber below any damaging temperature: for example, 212° F. or less.

At such time as the cooling operation is taking place, heat is transferred from the operating chamber 12 through the side wall 14a of the inner housing 14. The heat transfer medium 24, for example, water, is vaporized around the outer wall 14a of the operating chamber 12 which passes as a vapor through the chamber 22 into contiguous relation with the wall 14b of the heat transfer chamber 22. There, heat from the vaporized transfer medium 34 passes into the lower temperature mass of the heat sink medium 32, causing the vapor to condense back into a liquid form and thereon be soaked up into the wicking member 30.

Simultaneously, liquid at the other end of wicking member 30 is being vaporized into vapor by the heat coming through the wall 14a of operating chamber 12. The liquid entering the wicking member 30 adjacent the heat sink medium 32 is transported by capillary action through the wicking member 30 to replace the liquid which is being vaporized adjacent the operating chamber 12. Thus, a continuous vaporization and condensation operation is maintained so long as the temperature in the operating chamber 12 is sufficient to vaporize the liquid and the temperature of the heat sink medium 32 is low enough to condense the vapors back into a liquid.

The time interval of six hours, given as an example, might be more or less depending on the particular well bore and particular well logging operation. In any event, the time interval in which a logging tool is allowed to remain in a well bore having temperature high enough to be damaging is always kept to a minimum since any damaged parts can cause the tool to malfunction and will in any event need to be replaced at considerable expense before the tool may be used again.

It is to be noted that modifications and other embodiments of this invention as herein disclosed may be made without departing from the scope or purview of the appended claims.

What is claimed is:

1. In wellbore logging apparatus including heat transfer apparatus for cooling enclosed electrical components, the combination comprising:
   (a) an electrical components operating chamber sealed from the remainder of said heat transfer apparatus and defined by a chamber entry opening, a first section of an elongated inner housing, and a first bulkhead;
   (b) a sealed heat sink chamber defined by a second section of said inner housing, said first bulkhead, and a second bulkhead;
   (c) a self-contained and sealed heat transfer chamber defined by an outer housing, said inner housing, said second bulkhead and a third bulkhead as being a generally annular space terminating into a cylindrical space;
   (d) said heat transfer chamber completely enclosing said first section and said second section of said inner housing in heat conducting relationship;
   (e) wicking means occupying a selected portion of said transfer chamber along its length to effect efficient transfer of liquid within said heat transfer chamber to a first wall section adjacent said operating chamber and to permit passage of vapor from said first wall section to said second section on said heat sink chamber;
   (f) a heat sink medium disposed within said heat sink chamber with efficient heat transfer relationship from said heat transfer chamber to said heat sink medium through said second section; and
   (g) a heat transfer medium disposed within said heat transfer chamber and operative
       (1) to be vaporized from a liquid into vapor by heat received from said first section on said operating chamber,
       (2) to be passed as a vapor to the vicinity of said second section on said heat sink chamber,
       (3) to be condensed from said vapor into a liquid through heat removal by said heat sink medium, and
       (4) to be drawn as a liquid through said wicking means back to said first wall section of said outer housing adjacent to said operating chamber to be again vaporized.

2. The combination of claim 1 wherein said wicking means is woven.

3. The combination of claim 1 wherein said wicking means is felted.

4. The combination of claim 1 wherein said heat sink medium is a metal alloy having a selected specific heat.

5. The combination of claim 4 wherein said heat sink medium is a eutectic material having a selected specific heat of fusion.

6. The combination of claim 5 wherein said heat sink medium is a metal alloy comprised of bismuth, tin and lead.

7. The combination of claim 6 wherein said metal alloy also includes cadmium and wherein the resulting alloy melts at a temperature close to 160° F.

8. The combination of claim 1 wherein said outer housing is fitted within a cylindrical vacuum bottle for operation in a well logging instrument.

9. The combination of claim 1 wherein said heat transfer medium is water.

10. The combination of claim 1 wherein said wicking is sintered.

11. The combination of claim 1 wherein said heat transfer medium is isolated from all electronic components within said apparatus.

12. The combination of claim 8 wherein the inner housing of said vacuum bottle is the same member as the outer housing of said apparatus.

13. The combination of claim 1 wherein said inner housing, said outer housing and all said bulkheads are integral.

14. The combination of claim 4 wherein said heat sink medium is a eutectic material having a selected specific heat of fusion and wherein said outer housing is fitted within a cylindrical vacuum bottle for operation in a well logging instrument.

15. The combination of claim 4 wherein said heat sink medium is a eutectic material having a selected specific heat of fusion and wherein said heat transfer medium is water.

16. The combination of claim 14 wherein said heat sink medium is a eutectic material having a selected specific heat of fusion, wherein said heat transfer medium is water, and wherein said outer housing is fitted within a cylindrical vacuum bottle for operation in a well logging instrument.

17. The combination of claim 16 wherein said heat transfer medium is isolated from all electronic components within said apparatus and wherein the inner housing of said vacuum bottle is the same member as the outer housing of said apparatus.

18. The combination of claim 13 wherein said outer housing is fitted within a cylindrical vacuum bottle for operation in a well logging instrument and wherein said heat transfer medium is isolated from all electronic components within said apparatus.

19. The combination of claim 4 wherein said metal alloy also includes cadmium and wherein the resulting alloy melts at a temperature close to 160° F.; wherein said heat transfer medium is isolated from all electronic components within said apparatus; wherein said outer housing is fitted within a cylindrical vacuum bottle for operation in a well logging instrument; wherein said heat transfer medium is isolated from all electronic components within said apparatus; and wherein the inner housing of said vacuum bottle is the same member as the outer housing of said apparatus.

* * * * *